US010847240B2

(12) United States Patent
Jang et al.

(10) Patent No.: US 10,847,240 B2
(45) Date of Patent: Nov. 24, 2020

(54) MEMORY DEVICE WITH TEST CIRCUIT WHICH GENERATES ASYCHRONOUS SIGNAL BASED ON DELAY AND CONTROLS PERIPHERAL CIRCUIT BASED ON ASYNCHRONOUS SIGNAL, OPERATING METHOD OF MEMORY DEVICE, AND OPERATING METHOD OF TEST SYSTEM INCLUDING MEMORY DEVICE

(71) Applicant: SAMSUNG ELECTRONICS CO., LTD., Suwon-si (KR)

(72) Inventors: Seong-Gwon Jang, Asan-si (KR); Joosung Yun, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/046,453

(22) Filed: Jul. 26, 2018

(65) Prior Publication Data

US 2019/0180835 A1   Jun. 13, 2019

(30) Foreign Application Priority Data

Dec. 12, 2017 (KR) .................... 10-2017-0170427

(51) Int. Cl.
| | |
|---|---|
| *G11C 29/02* | (2006.01) |
| *G11C 7/22* | (2006.01) |
| *G11C 29/50* | (2006.01) |
| *G11C 29/12* | (2006.01) |

(52) U.S. Cl.
CPC .......... *G11C 29/023* (2013.01); *G11C 7/222* (2013.01); *G11C 29/12015* (2013.01); *G11C 29/50012* (2013.01)

(58) Field of Classification Search
CPC .. G11C 29/023; G11C 7/222; G11C 29/50012
See application file for complete search history.

(56) References Cited

U.S. PATENT DOCUMENTS

| | | | | |
|---|---|---|---|---|
| 5,959,915 A | * | 9/1999 | Kwon ............. | G01R 31/31922 365/201 |
| 6,489,819 B1 | * | 12/2002 | Kono ..................... | G11C 29/14 327/141 |
| 7,080,302 B2 | | 7/2006 | Takagi | |
| 7,137,022 B2 | | 11/2006 | Ishikawa | |
| 7,752,516 B2 | | 7/2010 | Sera | |
| 8,760,945 B2 | * | 6/2014 | Jeon ....................... | G11C 8/18 365/193 |

(Continued)

FOREIGN PATENT DOCUMENTS

| | | |
|---|---|---|
| JP | 2002-296321 A | 10/2002 |
| KR | 10-0541543 B1 | 1/2006 |

*Primary Examiner* — Mushfique Siddique
(74) *Attorney, Agent, or Firm* — Sughrue Mion, PLLC

(57) ABSTRACT

A memory device includes a memory cell array, a peripheral circuit, a test mode register set, and a test circuit. The peripheral circuit stores data in the memory cell array or reads data from the memory cell array. The test mode register set stores a delay value. In response to detecting a clock select signal received from outside the memory device, the test circuit generates an asynchronous signal from a clock received from the outside based on the delay value, and controls the peripheral circuit based on the asynchronous signal.

19 Claims, 9 Drawing Sheets

(56) References Cited

U.S. PATENT DOCUMENTS

| | | | |
|---|---|---|---|
| 2001/0015924 A1* | 8/2001 | Arimoto | G11C 29/1201 |
| | | | 365/201 |
| 2002/0167859 A1* | 11/2002 | Chun | G11C 7/12 |
| | | | 365/233.1 |
| 2003/0011396 A1 | 1/2003 | Takagi | |
| 2003/0018939 A1* | 1/2003 | Kinoshita | G01R 31/31857 |
| | | | 714/742 |
| 2003/0031082 A1* | 2/2003 | Sawada | G11C 7/222 |
| | | | 365/233.1 |
| 2004/0013016 A1* | 1/2004 | Yamazaki | G11C 29/56012 |
| | | | 365/201 |
| 2004/0222828 A1 | 11/2004 | Ishikawa | |
| 2006/0225010 A1 | 10/2006 | Sera | |
| 2006/0239087 A1* | 10/2006 | Shin | G11C 7/22 |
| | | | 365/194 |
| 2006/0268624 A1* | 11/2006 | Jang | G11C 29/32 |
| | | | 365/189.011 |
| 2007/0069795 A1* | 3/2007 | Kim | G06F 1/04 |
| | | | 327/291 |
| 2009/0180341 A1* | 7/2009 | Ide | G11C 7/222 |
| | | | 365/203 |
| 2012/0163098 A1* | 6/2012 | Ku | G11C 7/1045 |
| | | | 365/189.05 |
| 2012/0166894 A1 | 6/2012 | Jang | |
| 2015/0131392 A1 | 5/2015 | Aizawa | |

* cited by examiner

MEMORY DEVICE WITH TEST CIRCUIT WHICH GENERATES ASYCHRONOUS SIGNAL BASED ON DELAY AND CONTROLS PERIPHERAL CIRCUIT BASED ON ASYNCHRONOUS SIGNAL, OPERATING METHOD OF MEMORY DEVICE, AND OPERATING METHOD OF TEST SYSTEM INCLUDING MEMORY DEVICE

CROSS-REFERENCE TO RELATED APPLICATIONS

This application claims priority under 35 U.S.C. § 119 from Korean Patent Application No. 10-2017-0170427 filed on Dec. 12, 2017, in the Korean Intellectual Property Office, the disclosure of which is incorporated by reference herein in its entirety.

BACKGROUND

Apparatuses, devices, and methods consistent with the present disclosure relate to a semiconductor memory device, and more particularly, relate to a memory device for testing whether the memory device operates normally, an operating method of the memory device, and an operating method of a test system including the memory device.

A memory tester is used to test a semiconductor memory device produced through a package process. The memory tester may determine whether a memory device is problematic, through a test operation. As the number of memory devices determined as being defective increases, a ratio of usable memory devices may decrease. In the case where the yield decreases, manufacturing costs of memory devices may increase.

In general, a memory device may operate in synchronization with a clock received from the outside, but may operate based on an asynchronous signal in a test operation. To test the memory device, the memory tester may transmit an asynchronous signal for controlling an operation of the memory device through a pin separate from a clock pin. The memory device may change an operating time of an internal circuit, based on the asynchronous signal. In the case where the memory device operates normally even though the operating time of the internal circuit is changed, the memory tester may determine that the memory device is normal.

However, in the case where a noise occurs at a pin to which the asynchronous signal is input, a determination result of the memory tester may vary with the noise. Due to the noise, the memory tester may determine a normal memory device as being defective. As such, the accuracy of the result of testing the memory device may decrease.

SUMMARY

It is an aspect to provide a memory device for providing an accurate test result of the memory device regardless of noise, an operating method of the memory device, and an operating method of a test system including the memory device.

According to an aspect of an exemplary embodiment, a memory device includes a memory cell array; a peripheral circuit configured to store data in the memory cell array or to read data from the memory cell array; a test mode register set (TMRS) configured to store a delay value; and a test circuit, wherein, in response to detecting a clock select signal received from outside the memory device, the test circuit is configured to generate an asynchronous signal from a clock received from the outside based on the delay value; and control the peripheral circuit based on the asynchronous signal.

According to another aspect of an exemplary embodiment, an operating method of a memory device includes detecting a clock select signal received from outside the memory device; in response to detecting the clock select signal, generating, internally to the memory device, an asynchronous signal from a clock received from the outside the memory device, based on a delay value stored in a test mode register set (TMRS) of the memory device; and controlling a peripheral circuit of the memory device based on the asynchronous signal.

According to yet another aspect of an exemplary embodiment, an operating method of a test system which includes a memory tester and a memory device includes setting, by the memory tester, a delay value in a test mode register set (TMRS) of the memory device; transmitting, by the memory tester, a clock select signal to the memory device before a particular operation of the memory device is completed; generating, by the memory device, an asynchronous signal from a clock received from the memory tester, the asynchronous signal generated based on the delay value in response to the memory device detecting the clock select signal; and controlling, by the memory device, a peripheral circuit included in the memory device based on the asynchronous signal.

According to yet another aspect of an exemplary embodiment, a memory device comprises a memory cell array; and a test circuit comprising a test mode register that stores information for generating an asynchronous signal for controlling testing of the memory cell array, wherein the test circuit is configured to receive a clock and a clock select signal from outside the memory device, and in response to the clock select signal, generate, internally within the memory device, the asynchronous signal based on the clock and the information stored in the test mode register.

BRIEF DESCRIPTION OF THE FIGURES

The above and other aspects will become apparent by describing in detail exemplary embodiments thereof with reference to the accompanying drawings, in which.

DETAILED DESCRIPTION

Below, exemplary embodiments are described in detail and clearly to such an extent that one of ordinary skill in the art may easily implement the inventive concept.

Figure 1:
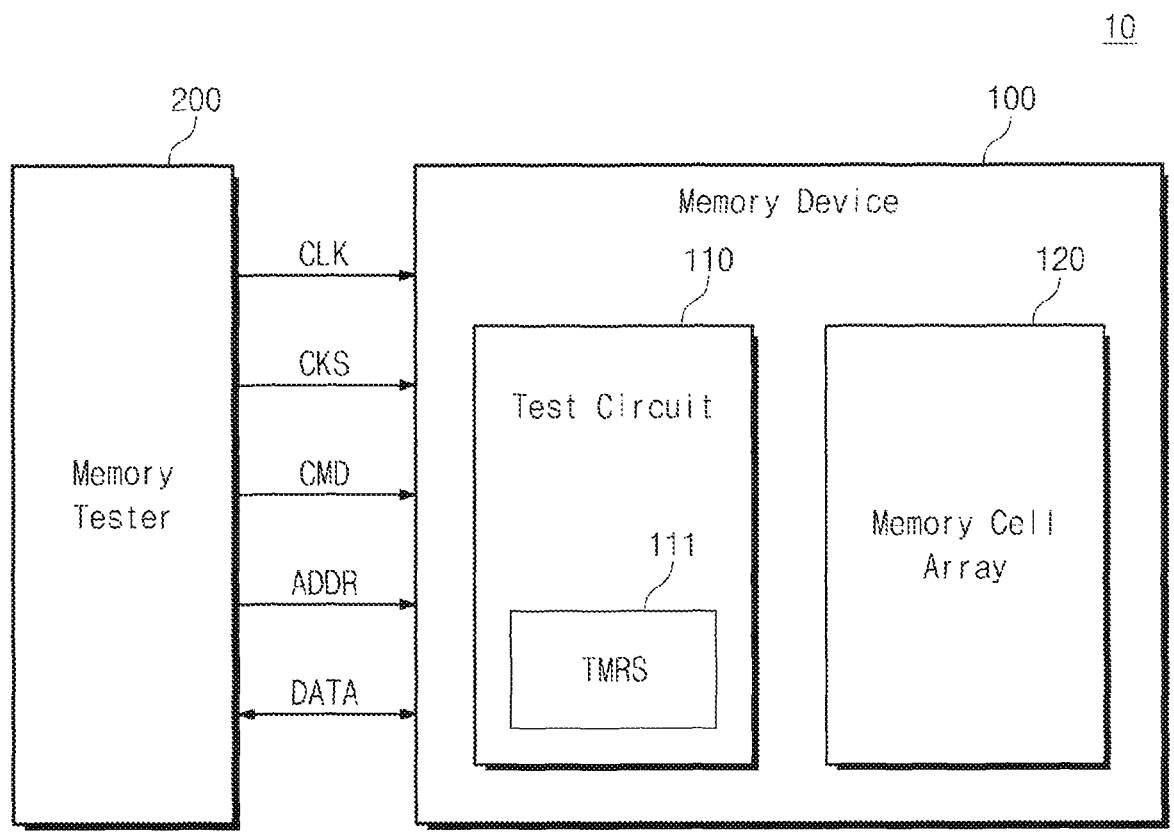
FIG. 1 is a block diagram of a test system according to an exemplary embodiment.

FIG. 1 is a block diagram of a test system according to an exemplary embodiment. Referring to FIG. 1, a memory system 10 may include a memory device 100 and a memory tester 200. In some exemplary embodiments, the memory device 100 may be a dynamic random access memory (DRAM). However, the inventive concept is not limited thereto. For example, in some exemplary embodiments, the memory device 100 may include a volatile memory, such as a static RAM (SRAM) or a synchronous DRAM (SDRAM), or a nonvolatile memory, such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM).

The memory tester 200 may test whether the memory device 100 operates normally. To test the memory device 100, the memory tester 200 may transmit various signals to the memory device 100 and may control an operation of the memory device 100. The memory tester 200 may determine whether the memory device 100 is passed or failed, based on the operation of the memory device 100.

The memory tester 200 may transmit a clock CLK, a clock select signal CKS, a command CMD, an address ADDR, and data "DATA" to the memory device 100. The memory tester 200 may transmit the command CMD, the address ADDR, and the data "DATA" for the purpose of storing data in the memory device 100 or reading data stored in the memory device 100. In some exemplary embodiments, the memory tester 200 may store write data at a particular address of the memory device 100 and may read data from an address at which the write data are stored. The memory tester 200 may compare the write data and the read data to determine whether the memory device 100 is failed.

The memory tester 200 may transmit the clock CLK and the clock select signal CKS to control an operating timing of the memory device 100. The memory tester 200 may transmit the clock CLK to the memory device 100 to allow the memory device 100 to operate in synchronization with the clock CLK. The memory tester 200 may transmit the clock select signal CKS to the memory device 100 to allow the memory device 100 to perform an asynchronous operation. In some exemplary embodiments, in the case where the clock select signal CKS is received, the memory device 100 may control an operation of an internal circuit in an asynchronous manner.

The memory tester 200 may transmit the clock CLK and the clock select signal CKS to the memory device 100 through different pins 115, respectively. In some exemplary embodiments, the memory device 100 may receive the clock CLK through a clock (CLK) pin and may receive the clock select signal CKS through a clock select signal (CKS) pin. When testing the memory device 100, the memory tester 200 may, in advance, set one pin (hereinafter referred to as a "preset pin") of various pins 115 of the memory device 100 to the clock select signal (CKS) pin. While a test operation is performed, the memory device 100 may recognize a signal input through the preset pin as the clock select signal CKS. As such, the memory device 100 may perform an asynchronous operation based on the clock select signal CKS. For example, the clock select signal (CKS) pin may be set to one of pins, to which asynchronous signals are transmitted, such as a clock enable (CKE) pin, a row access strobe (RAS) pin, and the like.

The memory device 100 may include a test circuit 110 and a memory cell array 120. When a test operation is performed on the memory device 100, the test circuit 110 may control internal circuits including the memory cell array 120, based on signals provided from the memory tester 200. For example, in the case where an activate command ACT is transmitted, the test circuit 110 may activate any word line (not illustrated) included in the memory cell array 120. Afterwards, in the case where a read command RD or a write command WR is transmitted, the test circuit 110 may read data "DATA" from the activated word line or may write data "DATA" to the activated word line.

In the case where the clock select signal CKS is received, the test circuit 110 may control an internal circuit. In some exemplary embodiments, the test circuit 110 may generate a separate asynchronous signal to control an operating time of the internal circuit. The internal circuit may start or stop an operation based on the generated asynchronous signal.

The test circuit 110 may include a test mode register set (TMRS) 111. The TMRS 111 may store information for performing a test operation. The TMRS 111 may store information for the test circuit 110 to generate a separate asynchronous signal in response to the clock select signal CKS. In other words, the asynchronous signal is generated internal to the memory device 100 rather than being received from outside the memory device 100 and thus is separate from the clock select signal CKS received from outside. The information stored in the TMRS 111 may include delay information and pulse width information.

In the case where the clock select signal CKS is received, the test circuit 110 may generate an asynchronous signal based on the delay information and the pulse width information stored in the TMRS 111. The test circuit 110 may control the internal circuit based on the generated asynchronous signal. The test circuit 110 may control an operating start time point and an operating time of the internal circuit depending on the delay and pulse width of the asynchronous signal generated according to the stored delay and pulse width information.

As described above, the memory tester 200 according to an exemplary embodiment may transmit the clock select signal CKS to the memory device 100. The memory device 100 may internally generate an asynchronous signal in response to the clock select signal CKS. The memory device 100 may control the internal circuit based on the asynchronous signal. That is, the clock select signal CKS may trigger the memory device 100 to internally generate an asynchronous signal for controlling the internal circuit, rather than receiving the asynchronous signal from the outside.

As illustrated in FIG. 1, in some exemplary embodiments, the TMRS 111 may be included within the test circuit 110, but the inventive concept is not limited thereto. For example, the TMRS 111 may be provided inside of the memory device 100 but outside the test circuit 110. Below, for convenience of description, as illustrated in FIG. 1, it is assumed that the TMRS 111 is included within the test circuit 110.

Figure 2:
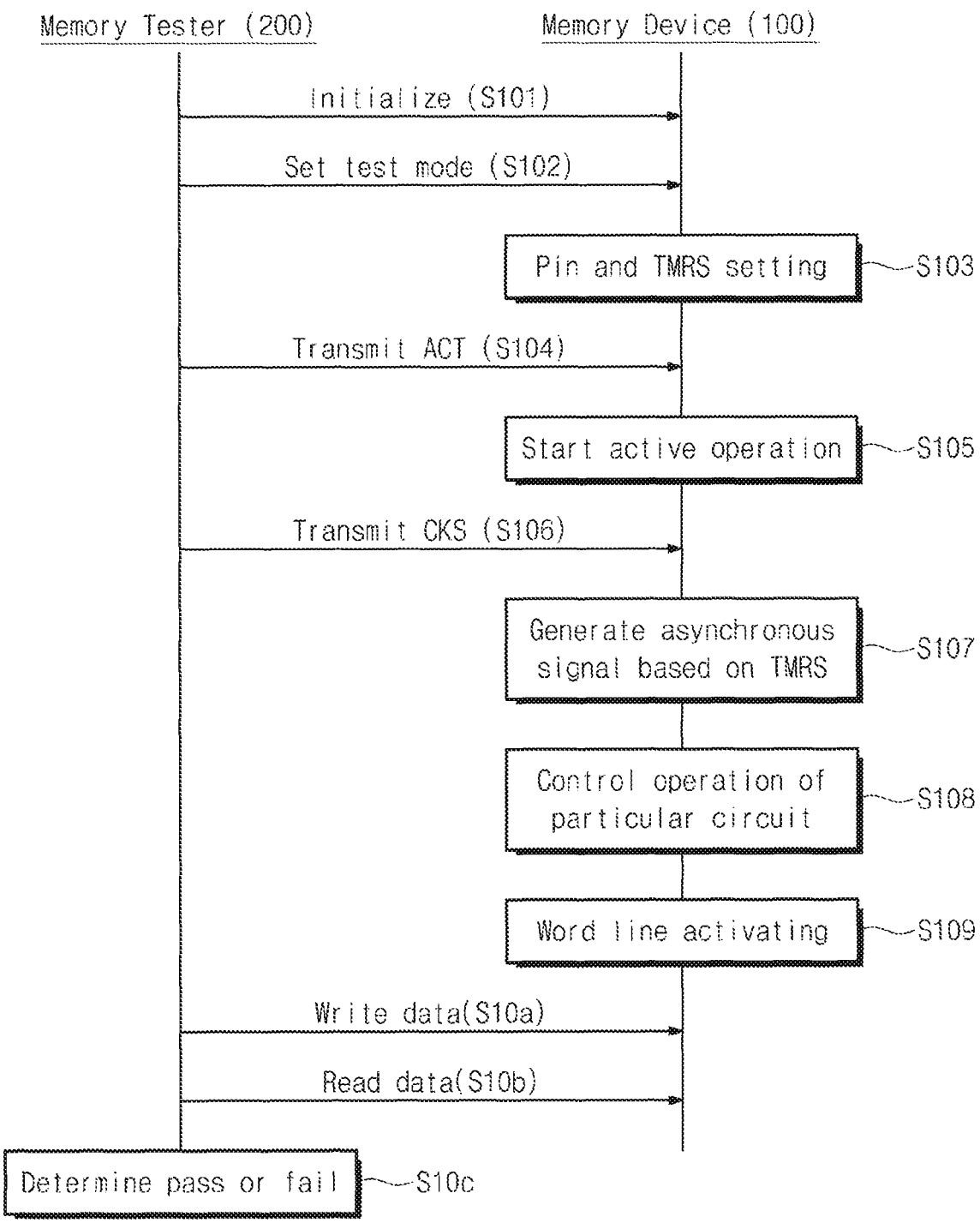
FIG. 2 is a flowchart illustrating a test operation of the test system of FIG. 1.

FIG. 2 is a flowchart illustrating a test operation of a test system of FIG. 1. Referring to FIGS. 1 and 2, in operation S101, the memory tester 200 may initialize the memory device 100. In some exemplary embodiments, the memory tester 200 may transmit a separate reset signal or an initialization command to the memory device 100 to initialize the memory device 100. For example, the initialization may be performed using the CMD line, or other pin/method. In the case where the memory device 100 is initialized, all data stored in the memory cell array 120 may be initialized. For example, in the case where the memory cell array 120 is initialized, data stored in each memory cell may be set to a given value, such as, for example, a low value.

In operation S102, the memory tester 200 may set the memory device 100 to a test mode. For example, the memory tester 200 may set the memory device 100 to the test mode using the CMD line, or other pin/method. In the case where the memory device 100 is set to the test mode, in operation S103, values of the clock select signal (CKS) pin and the TMRS 111 of the memory device 100 may be set. For example, one of a plurality of pins of the memory device 100 may be set as the clock select signal (CKS) pin. Also, a delay value and a pulse width value of the TMRS 111 may be set. The memory device 100 may perform a test operation based on the set pin and the set values of the TMRS 111.

In operation S104, the memory tester 200 may transmit the activate command ACT to the memory device 100. For example, the activate command ACT may be transmitted to the memory device 100 using the CMD line, or other pin/method. In operation S105, the memory device 100 may start to perform an activate operation in response to the activate command ACT. In some exemplary embodiments, the memory device 100 may sequentially perform operations for activating a word line of the memory cell array 120 based on the clock CLK.

While the activate operation is performed within the memory device 100, in operation S106, the memory tester 200 may transmit the clock select signal CKS to the memory device 100. The clock select signal CKS may be transmitted to the memory device 100 through the pin set in a test mode setting operation (S102 and S103).

In the case where the clock select signal CKS is received, in operation S107, the memory device 100 may generate an asynchronous signal based on the information stored in the TMRS 111. The asynchronous signal may be generated based on the delay value and the pulse width value set in operation S103.

In operation S108, the memory device 100 may control an operation of a particular circuit therein based on the asynchronous signal. The particular circuit may be one of a plurality of circuits that operate in the activation process. The memory device 100 may control an operating timing and an operating duration time of the particular circuit, based on a signal value of the asynchronous signal. That is, the operating timing and the operating duration time of the particular circuit operating depending on the activate command ACT may be variable. In the specification, the operating timing and the operating start time point may be used as the same meaning, and the operating time and the operating duration time may be used as the same meaning.

In operation S109, the memory device 100 may activate a word line of the memory cell array 120.

In operation S10a, the memory tester 200 may write data in the memory device 100. The memory tester 200 may write data in memory cells connected to the activated word line. In operation S10b, the memory tester 200 may read data stored in the memory device 100. The memory tester 200 may read data from memory cells where the data are stored in operation S10a.

In operation S10c, the memory tester 200 may determine whether the memory device 100 is passed or failed. The memory tester 200 may compare the write data written in the memory device 100 in operation S10a and the read data read from the memory device 100 in operation S10b and may determine whether the memory device 100 is passed or failed, based on the comparison result. For example, in the case where the write data and the read data are different, the memory tester 200 may determine that the memory device 100 is failed.

As described above, the memory tester 200 according to an exemplary embodiment may differently set the operating timing and the operating duration time of the particular circuit of the memory device 100 to test the memory device 100. By using the TMRS 111 including the stored values, the memory device 100 may generate the asynchronous signal and may control the particular circuit. In the case where the asynchronous signal is generated within the memory device 100, the asynchronous signal may not be affected by external noise (e.g., a pin noise). As such, the memory device 100 may accurately control the operating timing and the operating duration time of the particular circuit through the asynchronous signal.

As illustrated in FIG. 2, in some exemplary embodiments, the clock select signal CKS may be transmitted while the activate operation of the memory device 100 is performed, but the inventive concept is not limited thereto. In some exemplary embodiments, the memory tester 200 may transmit the clock select signal CKS while the memory device 100 performs an operation different from the activate operation. Below, for convenience of description, it is assumed that the clock select signal CKS is transmitted while the activate operation of the memory device 100 is performed.

Figure 3:
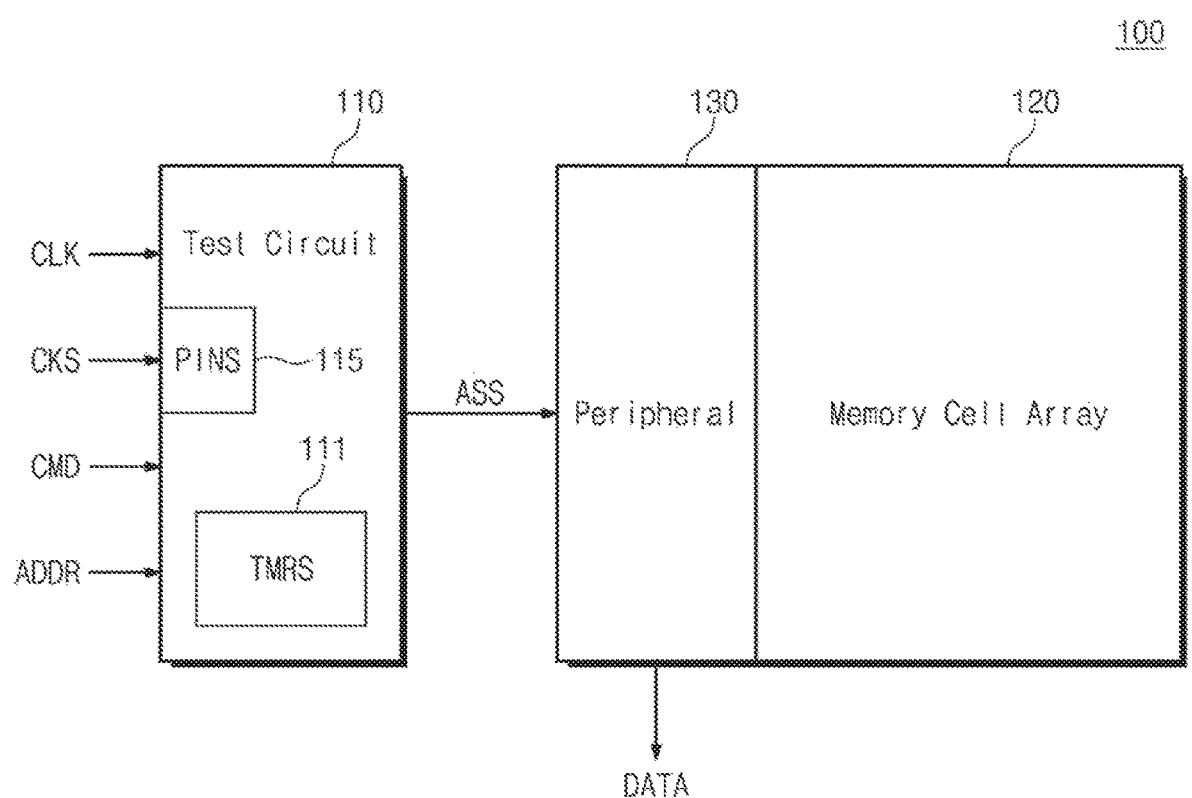
FIG. 3 is a block diagram illustrating a memory device of the test system of FIG. 1.

FIG. 3 is a block diagram illustrating a memory device of FIG. 1. Referring to FIGS. 1 and 3, the memory device 100 may include the test circuit 110, the memory cell array 120, and a peripheral circuit 130.

The test circuit 110 may include the TMRS 111. The test circuit 110 may receive the clock CLK, the clock select signal CKS, the command CMD, and the address ADDR. In the case where the clock select signal CKS is received, the test circuit 110 may generate an asynchronous signal ASS based on the TMRS 111. The test circuit 110 may transfer the generated asynchronous signal ASS to the peripheral circuit 130 to control the peripheral circuit 130.

After the initialization operation of the memory device 100, the memory device 100 may be set to the test mode. In the case where the memory device 100 is set to the test mode, the clock select signal (CKS) pin may be set, and one or more values of the TMRS 111 may be set. For example, the clock select signal (CKS) pin may be set to one of the clock enable (CKE) pin or the row access strobe (RAS) pin.

In some exemplary embodiments, the test circuit 110 may set one or more values of the TMRS 111 based on the command CMD and the address ADDR. For example, in the case where the command CMD and the address ADDR for setting the test mode are received, the test circuit 110 may recognize that the address ADDR indicates address information of the TMRS 111. The test circuit 110 may select a delay value and a pulse width value of the TMRS 111 corresponding to the address ADDR. The test circuit 110 may generate the asynchronous signal ASS by using the selected delay and pulse width values.

The memory cell array 120 may include a plurality of memory cells. Data "DATA" may be stored in each memory cell of the memory cell array 120. In some exemplary embodiments, in a test operation, the memory tester 200 may transmit the activate command ACT to the memory device 100 for the purpose of storing data "DATA" in the memory cell array 120 or reading data "DATA" from the memory cell array 120. In the case where the activate command ACT is received from the memory tester 200, the test circuit 110 may control the peripheral circuit 130 for the purpose of activating a word line of the memory cell array 120.

The peripheral circuit 130 may include circuits that operate to store data "DATA" in the memory cell array 120 or read data "DATA" from the memory cell array 120. For example, the peripheral circuit 130 may include a row decoder, a column decoder, a sense amplifier, an input/output gate, a data input/output circuit, and the like.

An operation of the peripheral circuit 130 may be controlled by the asynchronous signal ASS. As such, an operating start time point and an operating time of the peripheral circuit 130 may be changed. For example, a plurality of circuits included in the peripheral circuit 130 may sequentially operate for the activate operation. The test circuit 110 may control a particular circuit of the plurality of circuits based on the asynchronous signal ASS. As such, the operating timing and the operating duration time of the particular circuit for the activate operation may change.

Data "DATA" output from the peripheral circuit 130 through a read operation may be transmitted to the memory tester 200. The memory tester 200 may check the data "DATA" to determine whether the memory device 100 is passed or is failed.

Figures 4, 5:
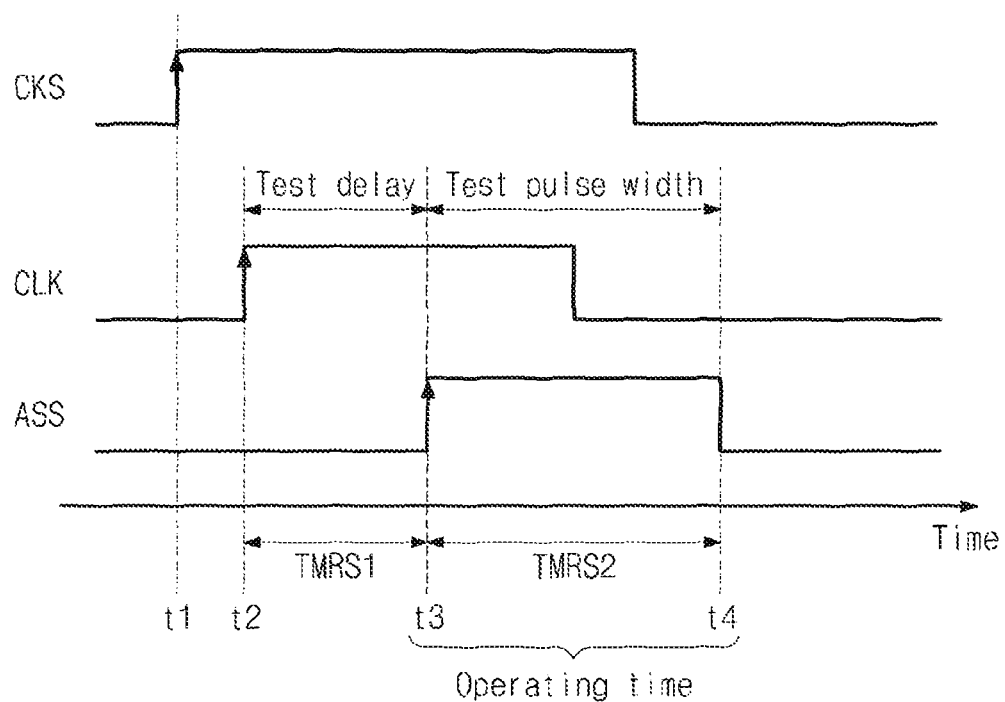
FIG. 4 is a view illustrating an example of an asynchronous signal generated in a test circuit according to an exemplary embodiment.
FIG. 5 is a view illustrating an example of a test mode register set (TMRS) according to an exemplary embodiment.

FIG. 4 is a view illustrating an example of an asynchronous signal generated in a test circuit according to an exemplary embodiment. Referring to FIGS. 3 and 4, in the case where the clock select signal CKS is received, the test circuit 110 may generate the asynchronous signal ASS based on the clock CLK.

The test circuit 110 may receive the clock select signal CKS at a first time t1. The test circuit 110 may generate the asynchronous signal ASS based on a rising edge of the clock CLK detected after the first time t1. The test circuit 110 may generate the asynchronous signal ASS based on the TMRS 111.

The TMRS 111 may include TMRS1 and TMRS2. The TMRS1 indicates delay information of the asynchronous signal ASS, and the TMRS2 indicates pulse width information of the asynchronous signal ASS. The TMRS1 and the TMRS2 may be set in advance upon setting the memory device 100 to the test mode as described above. That is, the memory tester 200 may set the TMRS1 and the TMRS2 in advance for the purpose of testing the memory device 100.

A test result of the memory device 100 may vary with the TMRS1 and the TMRS2. For example, in the case where the TMRS1 becomes smaller (i.e., in the case where a delay becomes shorter), the memory device 100 that is capable of being determined as being normal may be determined as being defective. In the case where the TMRS2 becomes greater (i.e., in the case where a pulse width becomes longer), the memory device 100 that is capable of being determined as being normal may be determined as being defective.

As illustrated in FIG. 4, after the first time t1 at which the clock select signal CKS is detected, a rising edge of the clock CLK may be detected at a time t2. The test circuit 110 may generate the asynchronous signal ASS delayed with respect to the rising edge of the clock CLK (i.e., delayed from t2) according to the TMRS1. That is, the test circuit 110 may generate the asynchronous signal ASS having a rising edge at a third time t3. In this case, t3 may be equal to t2+the delay indicated by the TMRS1. Also, the test circuit 110 may generate the asynchronous signal ASS having a pulse width according to the TMRS2. According to the above description, the test circuit 110 may generate the asynchronous signal ASS that is delayed with respect to a specific time point of the clock CLK for an amount of time indicated by the TMRS1 and maintains a high value for a length of time indicated by the TMRS2.

The test circuit 110 may control the peripheral circuit 130 by using the generated asynchronous signal ASS. As illustrated in FIG. 4, an operating start time point of the peripheral circuit 130 may be set to the third time t3 corresponding to the rising edge of the asynchronous signal ASS, and an operation of the peripheral circuit 130 may be maintained until a fourth time t4. The fourth time t4 may be equal to the third time t3+the pulse width time indicated by TMRS2. That is, the TMRS1 may be associated with the operating start time point of the peripheral circuit 130 that the test circuit 110 controls. The TMRS2 may be associated with the operating time of the peripheral circuit 130 that the test circuit 110 controls.

As described above, the test circuit 110 may control the peripheral circuit 130 based on a time point at which the clock select signal CKS (or a rising edge thereof) is detected. Accordingly, the memory tester 200 may determine the operating timing and the operating duration time of the peripheral circuit 130 through the clock select signal CKS. That is, in the case where the operating timing and the operating duration time of the peripheral circuit 130 are to be controlled, the memory tester 200 may transmit the clock select signal CKS to the memory device 100.

FIG. 5 is a view illustrating an example of a TMRS according to an exemplary embodiment. Referring to FIGS. 4 and 5, the TMRS 111 may include a TMRS1 field and a TMRS2 field. The TMRS1 indicates delay information of the asynchronous signal ASS, and the TMRS2 indicates pulse width information of the asynchronous signal ASS. The TMRS 111 may include a plurality of registers where different delay values are stored and may include a plurality of registers where different pulse width values are stored.

As illustrated in FIG. 5, the TMRS1 field may include a first delay value Delay[1], a second delay value Delay[2], and a third delay value Delay[3]. The TMRS2 field may include a first pulse width value Pulse Width[1], a second pulse width value Pulse Width[2], and a third pulse width value Pulse Width[3]. Upon setting a test mode for the memory device 100, the memory tester 200 may transmit, to the memory device 100, the address ADDR including address information of a first register R1 associated with the TMRS1 and address information of a second register R2 associated with the TMRS2. By using the address ADDR, the memory device 100 may select the third delay value Delay[3] as the TMRS1 and may select the first pulse width value Pulse Width[1] as the TMRS2.

In the case where the test circuit 110 generates the asynchronous signal ASS based on the TMRS 111 shown in FIG. 5, the test circuit 110 may generate the asynchronous signal ASS that is delayed with respect to the rising edge of the clock CLK by the third delay value Delay[3] and maintains the high value as long as the first pulse width value Pulse Width[1].

The TMRS 111 illustrated in FIG. 5 is only one example, and the inventive concept is not limited thereto. In the TMRS 111 according to an exemplary embodiment, the number of delay values and the number of pulse width values may be variously changed.

For example, the TMRS 111 may include one register associated with the TMRS1 and one register associated with the TMRS2. In this case, the address ADDR transmitted from the memory tester 200 may include information corresponding to a delay and a pulse width. Values of the TMRS 111 may be set by delay information and pulse width information included at the address ADDR. Delay and pulse width values transferred through the address ADDR may be respectively stored in corresponding registers.

Figure 6A:
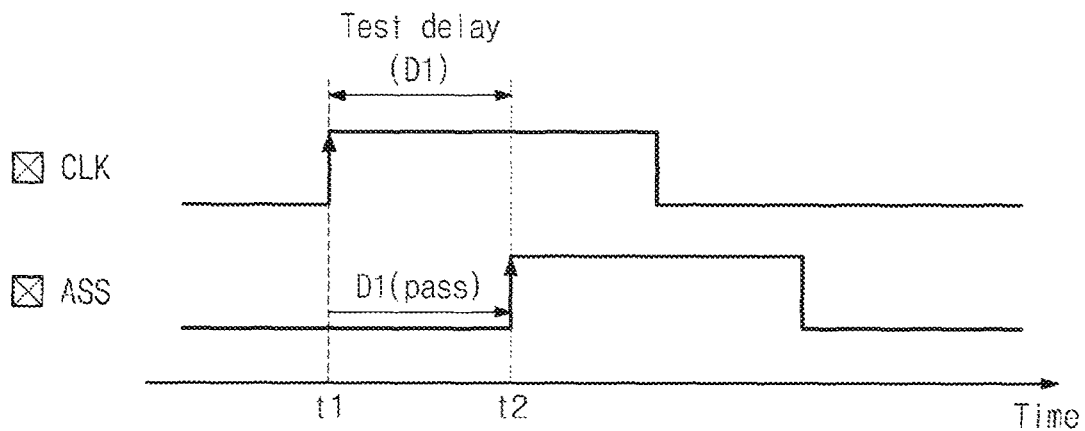
FIGS. 6A to 6C are views for describing a delay of an asynchronous signal, which is determined according to a generation method of the asynchronous signal.
Figure 6B:
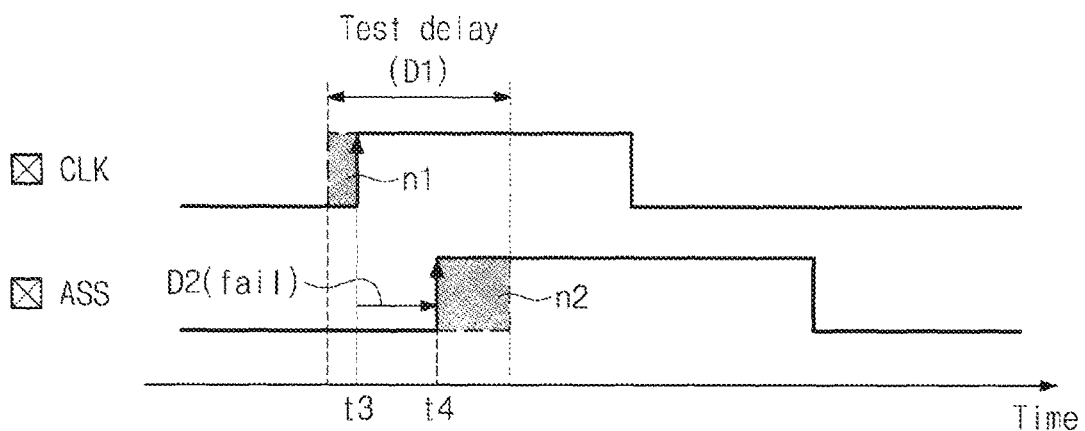
Figure 6C:
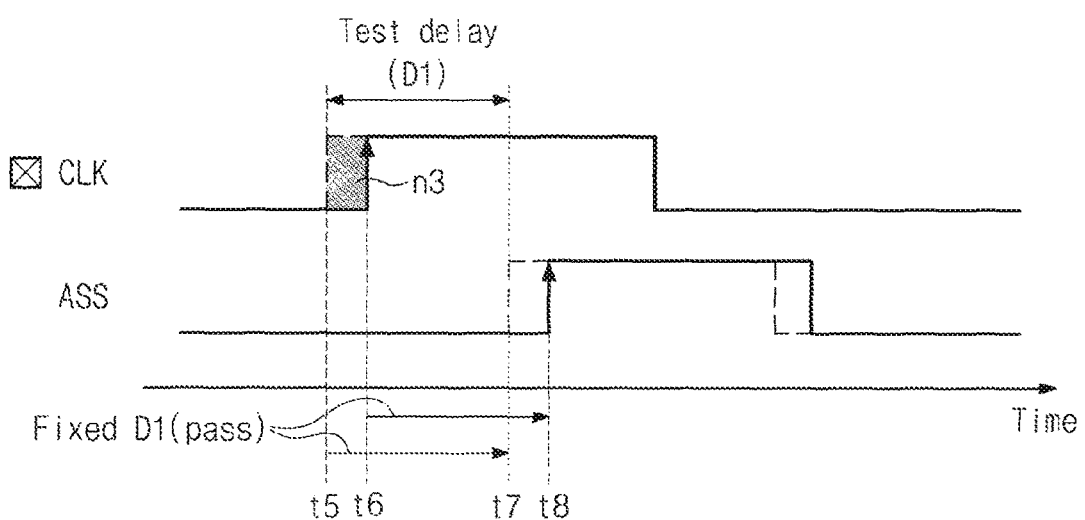

FIGS. 6A to 6C are views for describing a delay of an asynchronous signal, which is determined according to a generation method of the asynchronous signal. In detail, FIGS. 6A and 6B indicate the case where an asynchronous signal is transferred from the outside of a memory device as in the related art, and FIG. 6C indicates the case where an asynchronous signal according to an exemplary embodiment is generated within the memory device 100.

Referring to FIGS. 6A and 6B, the asynchronous signal ASS may be input to a memory device through a pin separate from a clock (CLK) pin. In this case, the asynchronous signal ASS may be generated in a memory tester. To test the memory device, the test circuit may generate the asynchronous signal ASS delayed with respect to a rising edge of the clock CLK by a delay D1. The memory device may receive the clock CLK and the asynchronous signal ASS through separate pins from the memory tester.

FIG. 6A indicates the case where no noise occurs at a clock (CLK) pin and an asynchronous signal (ASS) pin. Referring to FIG. 6A, a rising edge of the clock CLK may be detected at a first time t1, and a rising edge of the asynchronous signal ASS may be detected at a second time t2. In this case, a delay between the clock CLK and the asynchronous signal ASS may be a first delay D1. The memory device may control a peripheral circuit depending on the delay set by the memory tester. The peripheral circuit may start an operation at a second time t2, based on the asynchronous signal ASS. As the test result, the memory tester may determine that the memory device where the operation of the peripheral circuit is controlled depending on the first delay D1 is normal (or is passed).

FIG. 6B indicates the case where first noise n1 and second noise n2 occur at the clock (CLK) pin and the asynchronous signal (ASS) pin, respectively. Referring to FIG. 6B, since the clock (CLK) pin and the asynchronous signal (ASS) pin are different, the first noise n1 and the second noise n2 may be different. A rising edge of the clock CLK may be detected at a third time t3 due to the first noise n1, and a rising edge of the asynchronous signal ASS may be detected at a fourth time t4 due to the second noise n2. In this case, a delay between the clock CLK and the asynchronous signal ASS may be a second delay D2. The memory device may control a peripheral circuit depending on a delay (i.e., "D2") different from a delay (i.e., "D1") set by the memory tester. The peripheral circuit may start an operation at the fourth time t4, based on the asynchronous signal ASS. In the case where an operating start time point of the peripheral circuit varies with a time corresponding to a rising edge of the clock CLK, a leakage current may be generated. The leakage current may change a voltage level of the memory cell array 120. Accordingly, as the test result, the memory tester may determine that the memory device, the operation of which is stopped depending on the second delay D2, is defective (or is failed).

As such, in the case where the clock CLK and the asynchronous signal ASS are transmitted through separate pins from the outside of the memory device as in the related art, the test result may change due to the noise. As illustrated in FIG. 6B, a normal memory device may be determined as being failed, thereby making the accuracy of the test result low.

Referring to FIG. 6C, the clock CLK may be input to the memory device 100 through the clock (CLK) pin from the outside. The memory device 100 may internally generate the asynchronous signal ASS based on the clock CLK. To test the memory device 100, the memory tester 200 may set a delay value of the TMRS 111 to the first delay D1.

FIG. 6C indicates the case where third noise n3 occurs at the clock (CLK) pin. Due to the third noise n3, a rising edge of the clock CLK may be detected at a sixth time t6. The memory device 100 may generate the asynchronous signal ASS that is delayed with respect to the rising edge of the clock CLK as much as the set delay value (i.e., "D1") of the TMRS 111. A rising edge of the generated asynchronous signal ASS may be detected at an eighth time t8. The memory device 100 may control the peripheral circuit 130 based on the generated asynchronous signal ASS. In this case, the peripheral circuit 130 may start an operation at the eighth time t8.

In the case where no noise is generated at the clock (CLK) pin, a rising edge of the clock CLK may be detected at a fifth time t5. A rising edge of the asynchronous signal ASS that is delayed as much as the set delay value D1 of the TMRS 111 may be detected at a seventh time t7. In this case, the peripheral circuit that is controlled depending on the generated asynchronous signal ASS may start an operation at the seventh time t7.

In the case where an operating start time point of a peripheral circuit is fixed with respect to a time corresponding to the rising edge of the clock CLK (i.e., the peripheral circuit starts an operation from a time point when a time corresponding to the first delay D1 elapses from the rising edge of the clock CLK). In this case, even if the rising edge of the clock CLK is not detected until time t6 (due to the third noise n3), since the asynchronous signal ASS is generated internally after a delay set according to the delay value D1 of the TMRS 111, the rising edge of the asynchronous signal ASS is detected at time t8. Thus, regardless of whether a noise occurs, the test result of the memory device 100 may be fixed. Accordingly, the memory tester 200 may determine that the memory device 100 is passed, regardless of whether noise occurs.

As illustrated in FIGS. 6A and 6B, in the case where the clock CLK and the asynchronous signal ASS are received through the clock (CLK) pin and the asynchronous signal (ASS) pin, due to a delay difference and a noise difference of the pins, it may be difficult to exactly control the timing of the clock CLK and the asynchronous signal ASS. In contrast, according to the exemplary embodiments, as illustrated in FIG. 6C, since the asynchronous signal ASS is generated depending on a delay set in advance with respect to the clock CLK, the delay difference and the noise difference of the pins may be prevented and not occur. Accordingly, the test result of the memory device 100 may be prevented from being changed.

Figure 7A:
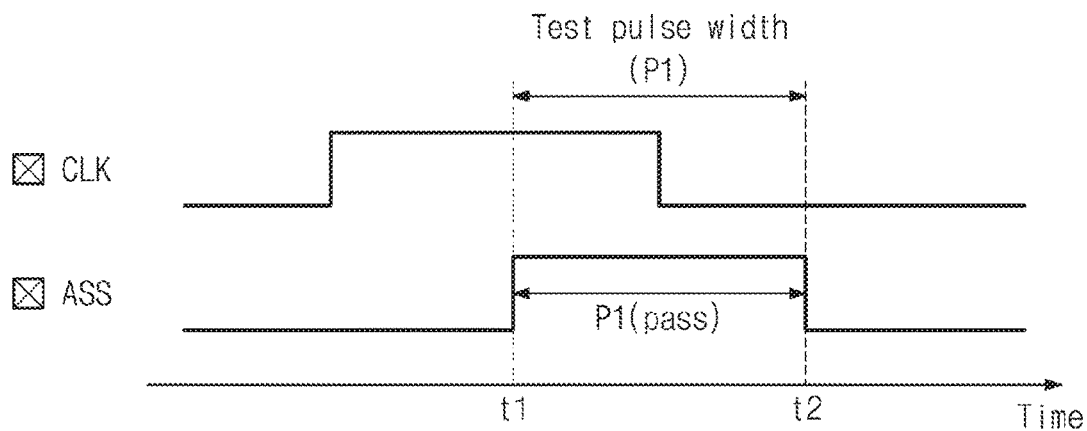
FIGS. 7A to 7C are views for describing a pulse width of an asynchronous signal, which is determined according to a generation method of the asynchronous signal.
Figure 7B:
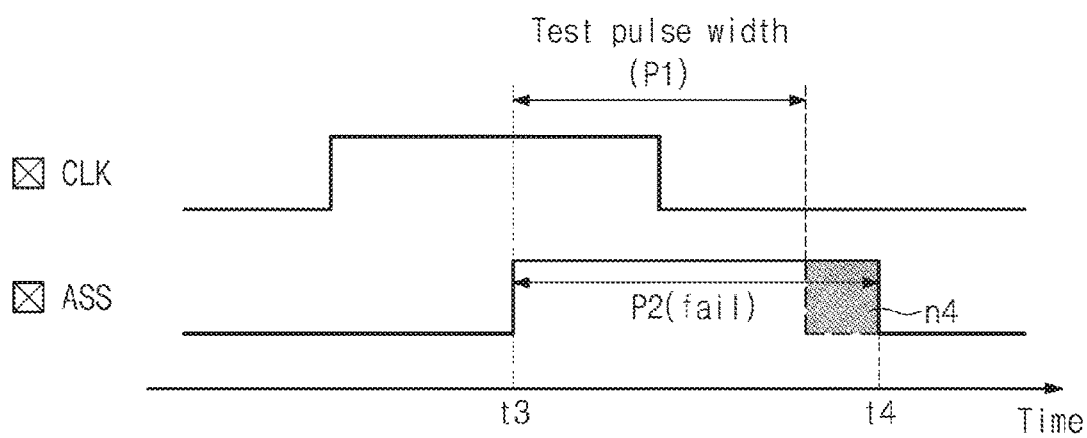
Figure 7C:
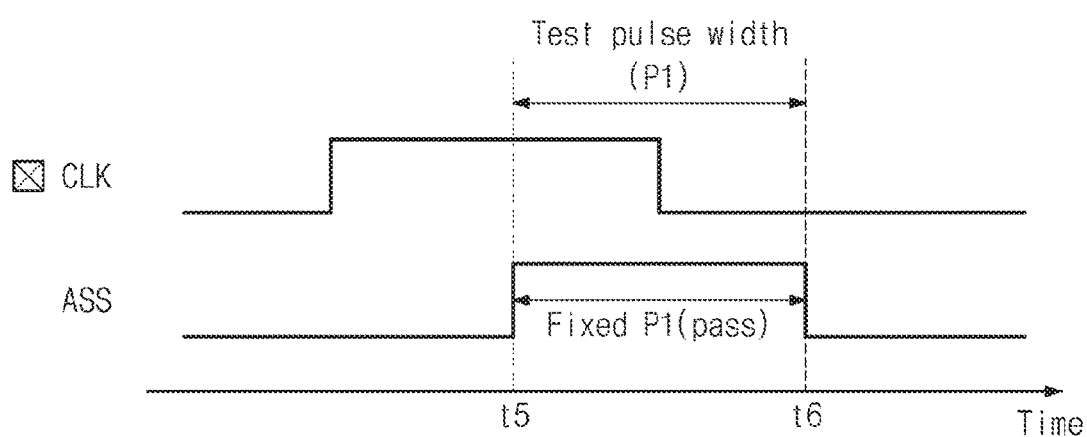

FIGS. 7A to 7C are views for describing a pulse width of an asynchronous signal, which is determined according to a generation method of the asynchronous signal. In detail, FIGS. 7A and 7B indicate the cases where an asynchronous signal is transferred from the outside of a memory device according to the related art, and FIG. 7C indicates the case where an asynchronous signal according to an exemplary embodiment is generated within the memory device 100.

Referring to FIGS. 7A and 7B, the asynchronous signal ASS may be generated in a memory tester. To test the memory device, the memory tester may generate the asynchronous signal ASS having a first pulse width P1. The memory device may receive the clock CLK and the asynchronous signal ASS through separate pins from the memory tester.

FIG. 7A indicates the case where no noise occurs at an asynchronous signal (ASS) pin. Referring to FIG. 7A, the asynchronous signal ASS may maintain a high value from a first time t1 to a second time t2. The memory device may maintain an operation of a peripheral circuit during the first pulse width P1. As the test result, the memory tester may determine that the memory device is passed.

FIG. 7B indicates the case where fourth noise n4 occurs at a pin through which the asynchronous signal ASS is received. Referring to FIG. 7B, due to the fourth noise n4, the asynchronous signal ASS may maintain the high value from a third time t3 to a fourth time t4. The memory device may control the peripheral circuit depending on the generated asynchronous signal ASS. That is, the peripheral circuit may operate from the third time t3 to the fourth time t4. A second pulse width P2 may be greater than the first pulse width P1 set by the memory tester. In the case where an operating duration time of the peripheral circuit varies with a pulse width, the test result may change. As the test result, the memory tester may determine that the memory device is failed.

As such, in the case where the asynchronous signal ASS is transmitted through a separate pin from the outside of the memory device, the operating duration time of the peripheral circuit may change due to the noise. In this case, as illustrated in FIGS. 7A and 7B, a normal memory device may be determined as being failed, thereby making the accuracy of the test result of the memory device low.

Referring to FIG. 7C, the memory device 100 may receive the clock CLK from the outside through the clock (CLK) pin. The memory device 100 may internally generate the asynchronous signal ASS based on the clock CLK. To test the memory device 100, the memory tester 200 may set a pulse width value of the TMRS 111 to the first pulse width P1.

The memory device 100 may generate the asynchronous signal ASS having the first pulse width P1. Since the asynchronous signal ASS is generated within the memory device 100, no noise may occur due to external factors. The asynchronous signal ASS may maintain a high value from a fifth time t5 to a sixth time t6. That is, the peripheral circuit 130 may operate from the fifth time t5 to the sixth time t6. In the case where the operating duration time of the peripheral circuit 130 is fixed, regardless of whether a noise occurs, the test result of the memory device 100 may be fixed. As the test result, the memory tester 200 may determine that the memory device 100 is passed.

Figure 8:
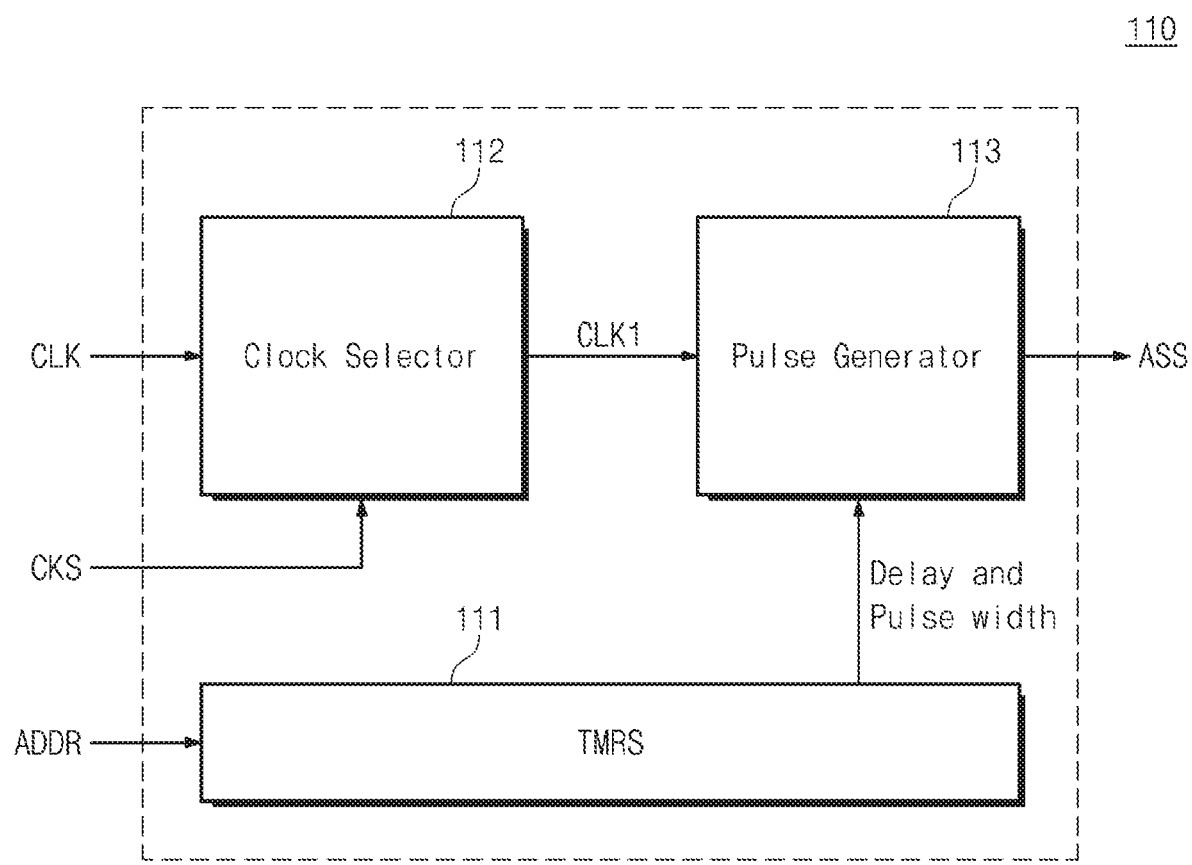
FIG. 8 is a block diagram illustrating an example of a test circuit according to an exemplary embodiment.

FIG. 8 is a block diagram illustrating an example of a test circuit according to an exemplary embodiment. Referring to FIGS. 1 and 8, the test circuit 110 may include the TMRS 111, a clock selector 112, and a pulse generator 113.

The TMRS 111 may store a delay value and a pulse width value for generating the asynchronous signal ASS. For example, as illustrated in FIG. 5, the TMRS 111 may store a plurality of delay values and a plurality of pulse width values. One of the plurality of delay values and one of the plurality of pulse width values may be selected based on the address ADDR received from the memory tester 200. The TMRS 111 may provide the selected delay information and the selected pulse width information to the pulse generator 113.

The clock selector 112 may receive the clock CLK and the clock select signal CKS. The clock selector 112 may detect the clock select signal CKS received through a preset pin. In the case where the clock select signal CKS is detected, the clock selector 112 may generate a first clock CLK1 based on the clock CLK. The clock selector 112 may output the generated first clock CLK1 to the pulse generator 113.

The pulse generator 113 may receive the first clock CLK1. The pulse generator 113 may generate the asynchronous signal ASS from the first clock CLK1 depending on the delay value and the pulse width value set in the TMRS 111. The asynchronous signal ASS may be a signal that is delayed with respect to the first clock CLK1 by the set delay value and maintains a high value for a length of time of the pulse width value. The pulse generator 113 may output the generated asynchronous signal ASS to control the peripheral circuit 130.

Figure 9:
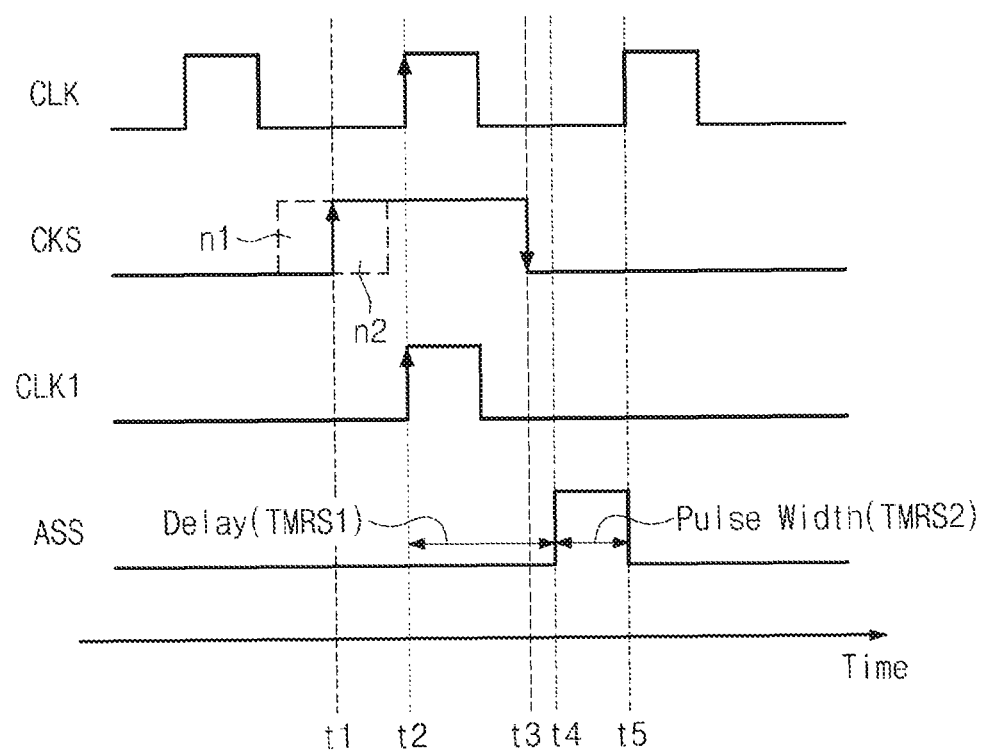
FIG. 9 is a timing diagram illustrating input/output signals of the test circuit of FIG. 8.

FIG. 9 is a timing diagram illustrating input/output signals of a test circuit of FIG. 8. Referring to FIGS. 8 and 9, the clock selector 112 may receive the clock CLK, the pulse of which is repeated at regular intervals. The clock selector 112 may detect a rising edge of the clock select signal CKS at a first time t1 and may detect a falling edge of the clock select signal CKS at a third time t3. The clock selector 112 may generate the first clock CLK1 based on the clock CLK between the first time t1 and the third time t3. The first clock CLK1 may be a signal of the same form as the clock CLK between the first time t1 and the third time t3. For example, the clock selector 112 may generate the first clock CLK1 through an AND operation of the clock CLK and the clock select signal CKS The clock select signal CKS may be received from a preset pin. The memory tester 200 may generate the clock select signal CKS such that the margin between the rising edge of the clock CLK and the rising edge of the clock select signal CKS is secured. As illustrated in FIG. 9, even though a time point of the rising edge of the clock select signal CKS changes due to the first noise n1 or the second noise n2, the time point of the rising edge of the clock select signal CKS may be earlier than a time point of the rising edge of the clock CLK. Accordingly, the clock selector 112 may generate the first clock CLK1 of the same form as the clock CLK regardless of whether a noise occurs. That is, the rising edge time of the first clock CLK1 may be matched with the rising edge time of the clock CLK.

The pulse generator 113 may receive the first clock CLK1 and may generate the asynchronous signal ASS delayed with respect to the rising edge of the first clock CLK1 by the value of TMRS1. For example, the pulse generator 113 may delay the first clock CLK1 as much as TMRS1 by using a buffer, a phase locked loop (PLL), or a delay locked loop (DLL).

The generated asynchronous signal ASS may also be delayed with respect to the rising edge of the clock CLK by the value of TMRS1. As such, the test circuit 110 may generate the asynchronous signal ASS delayed with respect to the rising edge of the clock CLK as much as a preset delay.

The pulse generator 113 may generate the asynchronous signal ASS having a pulse width set according to the value of TMRS2. In some exemplary embodiments, the pulse generator 113 may implement the pulse width of the asynchronous signal ASS by using the first clock CLK1. For example, the pulse generator 113 may adjust a duration time of a high value of the first clock CLK1 to implement the pulse width of the asynchronous signal ASS.

The generated asynchronous signal ASS may have a rising edge at a fourth time t4. The generated asynchronous signal ASS may have a falling edge at a fifth time t5. In the case where an operation of the peripheral circuit 130 is controlled depending on the asynchronous signal ASS generated internally, the operating start time point of the peripheral circuit 130 may be the fourth time t4. After maintaining an operation from the fourth time t4 to the fifth time t5, the peripheral circuit 130 may stop the operation after the fifth time t5.

As described above, the memory device 100 according to an exemplary embodiment may generate the asynchronous signal ASS having the same delay and the same pulse width even though noise occurs at a pin through which the clock select signal CKS is received. Accordingly, the memory tester 200 may test the memory device 100 depending on set values, and the accuracy of the result of testing the memory device 100 may be improved.

Figure 10:
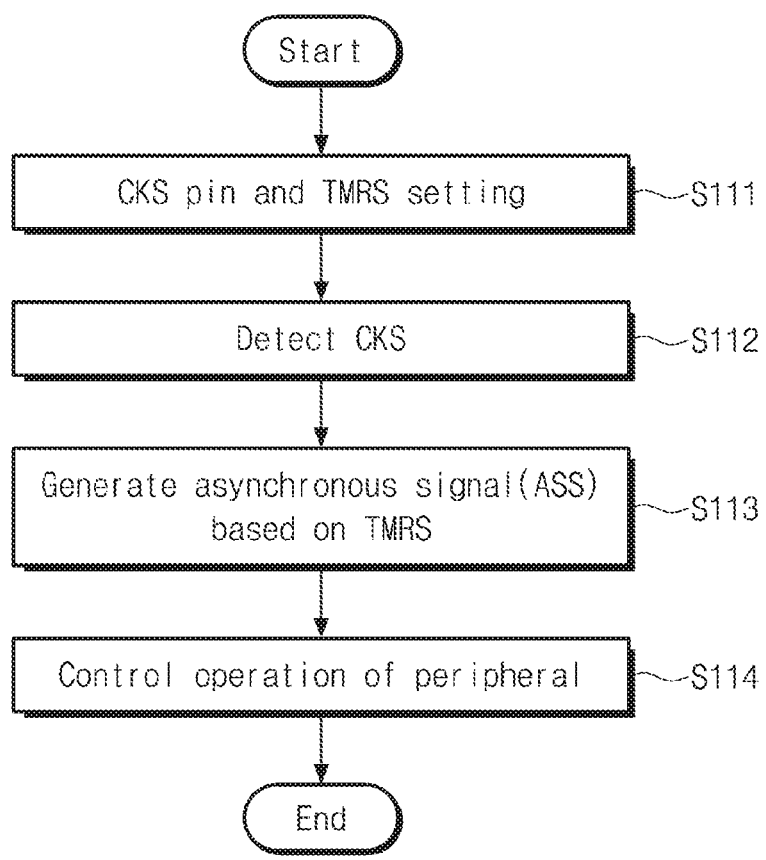
FIG. 10 is a flowchart illustrating an operating method of a memory device according to an exemplary embodiment.

FIG. 10 is a flowchart illustrating an operating method of a memory device according to an exemplary embodiment. Referring to FIGS. 1 and 10, in operation S111, the memory device 100 may set the clock select signal (CKS) pin and the TMRS 111. In some exemplary embodiments, the memory device 100 may set the clock select signal (CKS) pin and the TMRS 111 based on the command CMD and the address ADDR transmitted from the memory tester 200.

In operation S112, the memory device 100 may detect the clock select signal CKS. The memory device 100 may detect the clock select signal CKS from a signal received through the pin set in operation S111. In some exemplary embodiments, the memory device 100 may detect a rising edge of the clock select signal CKS. Alternatively, the memory device 100 may detect a rising edge and a falling edge of the clock select signal CKS.

In operation S113, the memory device 100 may generate the asynchronous signal ASS based on the TMRS 111. A delay value and a pulse width value of the TMRS 111 may be set in advance by the memory tester 200. The memory device 100 may generate the asynchronous signal ASS having the set delay and pulse width values. As illustrated in FIG. 9, a delay may indicate a time interval between a rising edge of the clock CLK and a rising edge of the asynchronous signal ASS. The pulse width may indicate a time period over which the asynchronous signal ASS maintains a high value. The memory device 100 may generate the asynchronous signal ASS delayed with respect to the rising edge of the clock CLK generated after detecting the rising edge of the clock select signal CKS.

In operation S114, the memory device 100 may control an operation of the peripheral circuit 130 of the memory device 100 by using the asynchronous signal ASS. The memory device 100 may control an operating start time point and an operating time of the peripheral circuit 130 depending on the asynchronous signal ASS. For example, the memory device 100 may operate the peripheral circuit 130 at the rising edge of the asynchronous signal ASS and may maintain the operation of the peripheral circuit 130 during a time period over which the high value of the asynchronous signal ASS is maintained.

As described above, the memory device 100 according to an exemplary embodiment may control the peripheral circuit 130 depending on a delay value and a pulse width value set in advance. According to an exemplary embodiment, since the asynchronous signal ASS is generated within the memory device 100, the asynchronous signal ASS may not be affected by an external noise. Also, since the asynchronous signal ASS is generated based on the clock CLK, even though noise occurs at the clock CLK, a time interval (i.e., a set delay value) between the clock CLK and the asynchronous signal ASS may be maintained.

Accordingly, regardless of whether noise occurs, the operation of the peripheral circuit 130 may be controlled depending on the condition set by the memory tester 200. That is, the operating timing and the operating duration time of the peripheral circuit 130 may be changed. Accordingly, the case where the memory device 100 is determined as being defective even though the memory device 100 is normal may decrease, and the accuracy of the result of testing the memory device 100 may be improved.

According to the inventive concept, an asynchronous signal used to test a memory device may not be affected by noise, and a result of testing the memory device may not vary with the noise. Accordingly, the case where the memory device is determined as being defective even though the memory device is normal may decrease, and the accuracy of the test result may be improved.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device comprising:
    a memory cell array;
    a peripheral circuit configured to store data in the memory cell array or to read data from the memory cell array;
    a test mode register set (TMRS) configured to store a delay value; and
    a test circuit,
    wherein, in response to detecting a clock select signal received from outside the memory device, the test circuit is configured to:
    generate, from a clock received from outside in accordance with the delay value, an asynchronous signal that is asynchronous with respect to the clock received from outside; and
    control the peripheral circuit based on the asynchronous signal,
    wherein the test circuit includes:
    a clock selector configured to perform an AND operation on the clock and the clock select signal to generate an internal clock; and
    a pulse generator configured to generate the asynchronous signal from the internal clock based on the delay value.

2. The memory device of claim 1, wherein the test circuit is configured to:
    control an operating start time point and an operating time of the peripheral circuit based on the asynchronous signal.

3. The memory device of claim 1, wherein the test circuit is configured to:
    generate the asynchronous signal delayed by the delay value from a time at which a rising edge of the clock is detected, after detecting the clock select signal.

4. The memory device of claim 1, wherein a pin through which the clock select signal is received is set in advance.

5. The memory device of claim 1, wherein the clock select signal is received during a process of activating a word line of the memory cell array.

6. The memory device of claim 1, wherein the TMRS is configured to store a pulse width value.

7. The memory device of claim 6, wherein the test circuit is configured to:
    generate the asynchronous signal based on the delay value and the pulse width value.

8. The memory device of claim 1, wherein the peripheral circuit is configured to:
    start an operation at a rising edge of the asynchronous signal; and stop the operation at a falling edge of the asynchronous signal.

9. An operating method of a memory device, the method comprising:
   detecting a clock select signal received from outside the memory device;
   in response to detecting the clock select signal, generating, internally to the memory device, an asynchronous signal from a clock received from the outside the memory device and in accordance with a delay value stored in a test mode register set (TMRS) of the memory device, the asynchronous signal being asynchronous with respect to the clock received from outside; and
   controlling a peripheral circuit of the memory device based on the asynchronous signal by a test circuit,
   wherein the test circuit includes:
   a clock selector configured to perform an AND operation on the clock and the clock select signal to generate an internal clock; and
   a pulse generator configured to generate the asynchronous signal from the internal clock based on the delay value.

10. The method of claim 9, wherein the generating includes:
   detecting a rising edge of the clock after detecting the clock select signal; and
   generating the asynchronous signal delayed by the delay value from a time at which the rising edge is detected.

11. The method of claim 9, wherein the asynchronous signal is generated based on the delay value, and a pulse width value stored in the TMRS.

12. The method of claim 9, wherein the controlling includes:
   starting an operation of the peripheral circuit at a rising edge of the asynchronous signal; and
   stopping the operation of the peripheral circuit at a falling edge of the asynchronous signal.

13. The method of claim 9, wherein a pin through which the clock select signal is received is set in advance.

14. A memory device comprising:
   a memory cell array; and
   a test circuit comprising a test mode register that stores information for generating an asynchronous signal for controlling testing of the memory cell array, a clock selector that performs an AND operation on a clock and a clock select signal to generate an internal clock, and a pulse generator that generates the asynchronous signal from the internal clock based on a delay value,
   wherein the test circuit is configured to receive the clock and the clock select signal from outside the memory device, and in response to the clock select signal, generate, internally within the memory device, the asynchronous signal from the clock and the information stored in the test mode register, the asynchronous signal being asynchronous with respect to the clock.

15. The memory device of claim 14, wherein the information comprises the delay value, and the test circuit generates the asynchronous signal from the clock delayed by the delay value.

16. The memory device of claim 15, wherein the information comprises a pulse width value, and the test circuit generates the asynchronous signal having a pulse width according to the pulse width value.

17. The memory device of claim 15, wherein the test circuit is configured to:
   generate the asynchronous signal delayed by the delay value from a time at which a rising edge of the clock is detected, after detecting the clock select signal.

18. The memory device of claim 14, wherein the test circuit is configured to:
   control an operating start time point and an operating time of a peripheral circuit of the memory device based on the asynchronous signal.

19. The memory device of claim 14, wherein the clock select signal is received during a process of activating a word line of the memory cell array.

* * * * *